(12) United States Patent
DeLaRosa

(10) Patent No.: US 6,472,123 B1
(45) Date of Patent: Oct. 29, 2002

(54) MULTIPLE PASS WRITE METHOD AND RETICLE

(75) Inventor: Eugene A. DeLaRosa, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/571,719

(22) Filed: May 15, 2000

(51) Int. Cl.[7] .............................. G03C 5/00; G03F 9/00
(52) U.S. Cl. .......................... 430/311; 430/5; 430/312; 430/322; 430/394
(58) Field of Search ......................... 430/5, 311, 312, 430/394, 322

(56) References Cited

U.S. PATENT DOCUMENTS

| | | |
|---|---|---|
| 5,523,580 A | 6/1996 | Davis |
| 5,528,047 A | 6/1996 | Nakajima |
| 5,552,250 A | 9/1996 | Nozue |
| 5,897,977 A * | 4/1999 | Carcia et al. ............ 430/5 |
| 5,932,491 A | 8/1999 | Wald et al. |
| 6,194,103 B1 * | 2/2001 | Tzu et al. ............... 430/5 |
| 6,210,843 B1 * | 4/2001 | Chen et al. ............. 430/5 |
| 6,251,547 B1 * | 6/2001 | Tzu et al. ............... 430/5 |
| 6,255,038 B1 * | 7/2001 | Hobbs ................ 430/316 |

FOREIGN PATENT DOCUMENTS

WO     97/48021     * 12/1997

* cited by examiner

Primary Examiner—Janet Baxter
Assistant Examiner—Amanda C. Walke
(74) Attorney, Agent, or Firm—Dickstein Shapiro Morin & Oshinsky LLP

(57) ABSTRACT

A multiple pass write method and a reticle made from the method are described. A reticle preform is provided including a transparent substrate, a metal layer, and a layer of a photoresist material. In a first write pass, a first portion of the photoresist material is exposed by an electron beam device. Then, in a second write pass, a second portion of the photoresist material is exposed. The first exposed portion is smaller or has finer dimensions than the second exposed portion. The exposed portions of photoresist material are removed, and the unexposed portions of photoresist serve as a mask. The uncovered portions of the conductive layer are etched. Further, the unexposed portions of the photoresist material are removed, creating a reticle through a multiple write pass strategy.

22 Claims, 6 Drawing Sheets

MULTIPLE PASS WRITE METHOD AND RETICLE

FIELD OF THE INVENTION

The present invention relates generally to the fabrication of photolithography devices such as reticles and semiconductor masks. More particularly, the present invention relates to a method of forming clear fields on a reticle and to reticles formed by electron-beam processing.

BACKGROUND OF THE INVENTION

In the manufacture of integrated circuits (ICs), microlithography is used to pattern various layers on a wafer. A layer of resist is deposited on the wafer and exposed using an exposure tool and a template, such as a reticle. During the exposure process, radiant energy, such as ultraviolet light, is directed through the reticle to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

The manufacture of ICs generally requires the use of numerous reticles or masks. Each individual reticle is expensive and time-consuming to manufacture. Mask production likewise involves substantial time and expense. The complete circuit patterning for a typical IC may require 10 to 20 or more reticles. Thus, accurate formation of reticles may yield savings in IC production costs.

Reticles and masks typically include an opaque thin film of a metal, such as chromium or molybdenum silicide, deposited in a pattern on a transparent substrate of quartz or glass. Defects in the pattern of chromium or molybdenum silicide may occur as a result of electrostatic charge added to the reticle preform during manufacture of the reticle. In conventional reticle patterning methodologies, a photoresist material overlays the layer of chromium. An electron beam exposes a portion of the photoresist material based upon a predetermined pattern. The exposed portion of the photoresist material is removed leaving uncovered a portion of the chromium. The unexposed photoresist material is then used to block the etch and leave the desired pattern in the metal to create the reticle.

Referring to FIGS. 1–3, a reticle preform 10 is shown in various stages of manufacture. The reticle preform 10 includes a substrate 12 located on a base 24. The substrate 12 is formed from a transparent material, such as quartz or glass. A layer of metal 13, such as, for example, chromium or molybdenum silicide, overlays the substrate 12 and is located beneath a layer of a photoresist material 14. The photoresist material 14 is formed of a material which is suitable for exposure by electrons.

An electron beam apparatus 16 is schematically shown (FIGS. 1, 2) in a position to direct electrons toward the photoresist material 14. The apparatus 16 includes an electron beam device 18, such as an electron beam gun, in mechanical and electrical connection with a controller 22. An actual electron beam gun, such as one manufactured by ETEC systems, is illustrated in FIG. 10. The electron beam device 18 directs a stream of electrons 26 toward the photoresist material 14 in a predetermined writing pattern 28, shown by the dashed lines on the photoresist material 14. The stream of electrons 26 preferably is controlled electrostatically.

Conventionally, a single predetermined writing pattern 28 is programmed into the controller 22, which controls the actions of the electron beam device 18 through the appendage 20. The writing pattern 28 is followed such that predetermined portions of the photoresist material 14 are exposed by the stream of electrons 26. The exposed portions of the photoresist material 14 are then removed. The remaining unexposed portions of the photoresist material 14 are used as a mask for etching the now exposed portions of the metal 13 to create a reticle 100 (FIG. 3) having the desired pattern of metal 13.

Specifically, and with reference to FIGS. 1 and 2, the writing pattern 28 separates the photoresist material 14 into a first strip 30, a second strip 32, a third strip 34, a first portion 36, a second portion 40, a third portion 70, and an interlayer portion 68. In FIG. 1, the writing pattern 28 is shown in dashed lines to indicate that the exposure process has only just started. In FIG. 2, the writing pattern 28 is shown in solid lines to indicate that the exposure process has been completed.

In the known process, the stream of electrons 26 exposes the portions 36, 40, 70, and 68 allowing for the subsequent removal of the photoresist material 14 resident in the exposed areas. One problem encountered through the conventional methodology is that using an electron beam to expose large photoresist areas, such as the second and third portions 40, 70, sometimes causes a localized build up of electrostatic energy in the reticle preform 10. The presence of electrostatic energy is detrimental to the accuracy of the stream of electrons 26, causing the stream 26 to be displaced, or to skew away, from the path intended by the writing pattern 28 (FIG. 2), thus altering the pattern of exposed photoresist material 14 from the desired writing pattern 28.

Applicant has determined that where electrostatic energy has caused a displacement of the electron stream 26 the photoresist material 14 exposed may not be consistent with the amount intended to be exposed according to the writing pattern 28. Instead, the exposed photoresist material 14 which is subsequently removed will leave first, second, third, and fourth uncovered areas of metal 56, 42, 71, and 69 which respectively were beneath the portions 36, 40, 70, and 68. Since the exposed portions 36, 40, 70, and 68 did not exactly correspond with the writing pattern 28, the underlying metal areas 56, 42, 71, and 69 also will not match the desired metal areas according to the writing pattern 28. In addition, the remaining unexposed portions of photoresist material 14, namely a first strip 50, a second strip 52 and a third strip 72 do not match with the unexposed strips that were to be formed according to the intended writing pattern 28.

After removing the exposed photoresist material 14 (as described above), the exposed areas of metal, namely the first, second, third and fourth uncovered areas of metal 56, 42, 71, 69 are etched. The remaining unexposed portions of photoresist, namely the first, second, and third strips 50, 52, 72 are washed away by a known method to form the reticle 100 (FIG. 3), including metal strips 62, 64, 66 positioned on the substrate 12.

Since the exposed and unexposed portions of the photoresist material 14 did not match the writing pattern 28, the metal strips 62, 64, 66 will likewise differ from the desired strips. The discrepancy between the actual metal strips 62, 64, 66 and the desired strips may be substantial enough to cause the reticle 100 to form defective semiconductor devices. Alternatively, additional measures may be required to compensate for the discrepancy.

SUMMARY OF THE INVENTION

The present invention provides a method of forming a reticle including exposing a first portion of the photoresist layer in accordance with a first writing pattern and exposing a second portion of the photoresist layer in accordance with a second writing pattern.

The present invention also provides a photolithography device for forming a semiconductor device that has a transparent substrate and a pattern of conductive material overlaying the substrate. The conductive material pattern is formed utilizing multiple write passes of electron beam energy.

The present invention also provides an apparatus for forming a photolithography device. The apparatus includes a device for projecting electrons at a layer of photoresist material and a controller for controlling the device such that a multiple of write passes based upon corresponding patterns sequentially expose portions of the photoresist material.

These and other advantages and features of the invention will be more readily understood from the following detailed description of the invention which is provided in connection with the accompanying drawings.

DETAILED DESCRIPTION OF PREFERRED EMBODIMENTS

Figure 1:
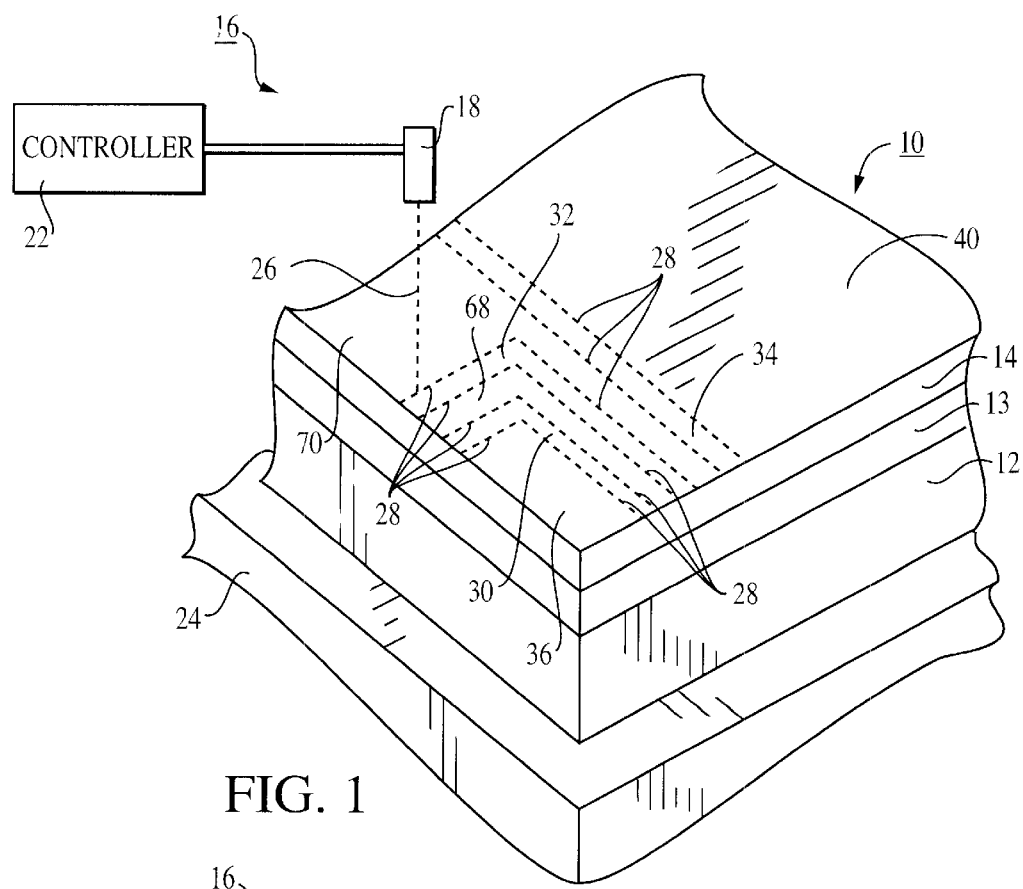
FIG. 1 is a partial perspective view showing a reticle being fabricated from a reticle preform by way of an electron beam apparatus.
Figure 2:
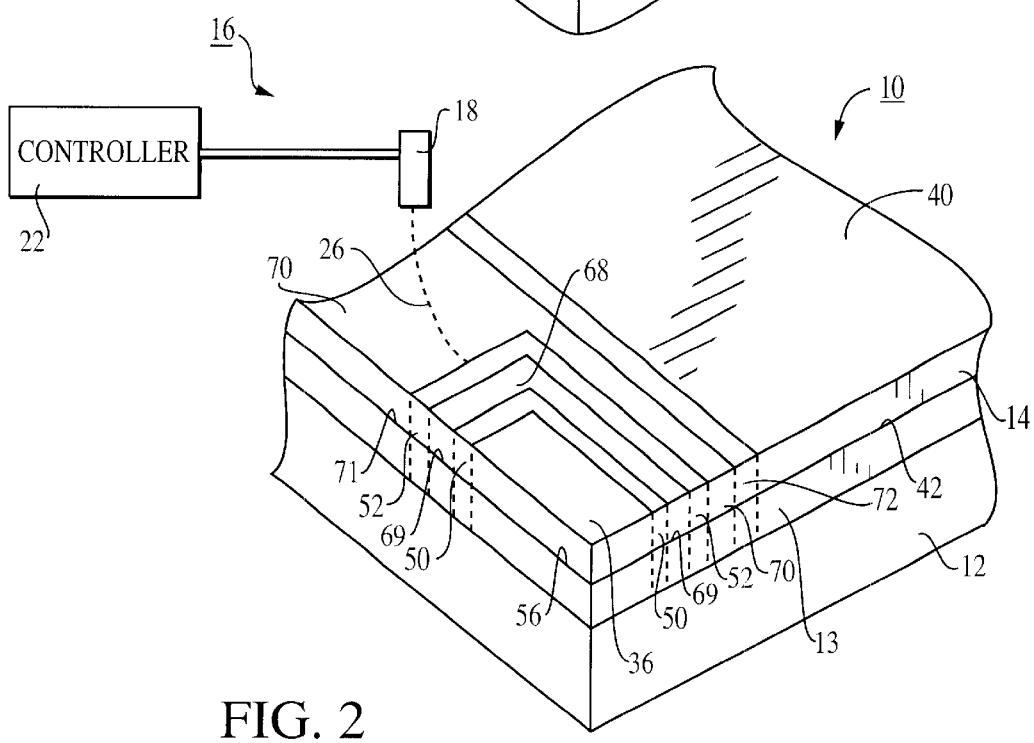
FIG. 2 is another partial perspective view of the reticle preform of FIG. 1 showing a skewed stream of electrons from the electron beam apparatus.
Figure 3:
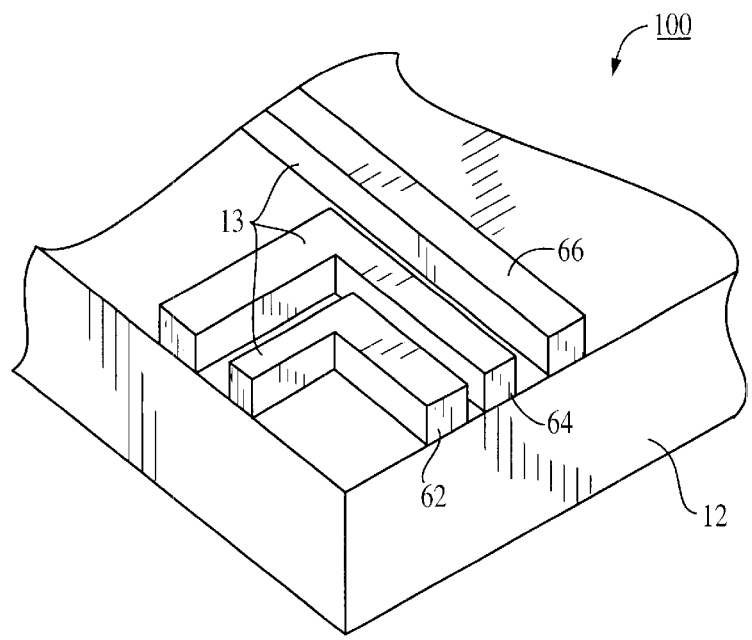
FIG. 3 is another partial perspective view showing a reticle formed from the reticle preform of FIGS. 1 and 2.

FIGS. 4–7 depict a reticle preform 10 and a reticle 200 in various stages of formation. The reticle preform 10 includes a transparent substrate 12, formed of quartz, glass, or another suitable material. A layer of metal 13 is deposited over the substrate 12, and a photoresist material 14 is deposited on the metal layer 13. The metal layer 13 may comprise any suitable conductive material, such as, for example, chromium, molybenum suicide, chromium fluoride, titanium nitride, or other like material.

Instead of exposing the photoresist material 14 through the use of a single write pass strategy, the present invention utilizes a multiple write pass strategy. The multiple write pass strategy minimizes build up of electrostatic charge on the reticle preform 10, which may cause inaccurate exposure of the photoresist material 14, leading to etched metallic strips which are improperly positioned, pitted, or uneven. The multiple write pass strategy leads to registration improvement for clear field reticles, such as the reticle 200, between the desired pattern and the actual pattern by minimizing displacement errors on live geometries.

Figure 4:
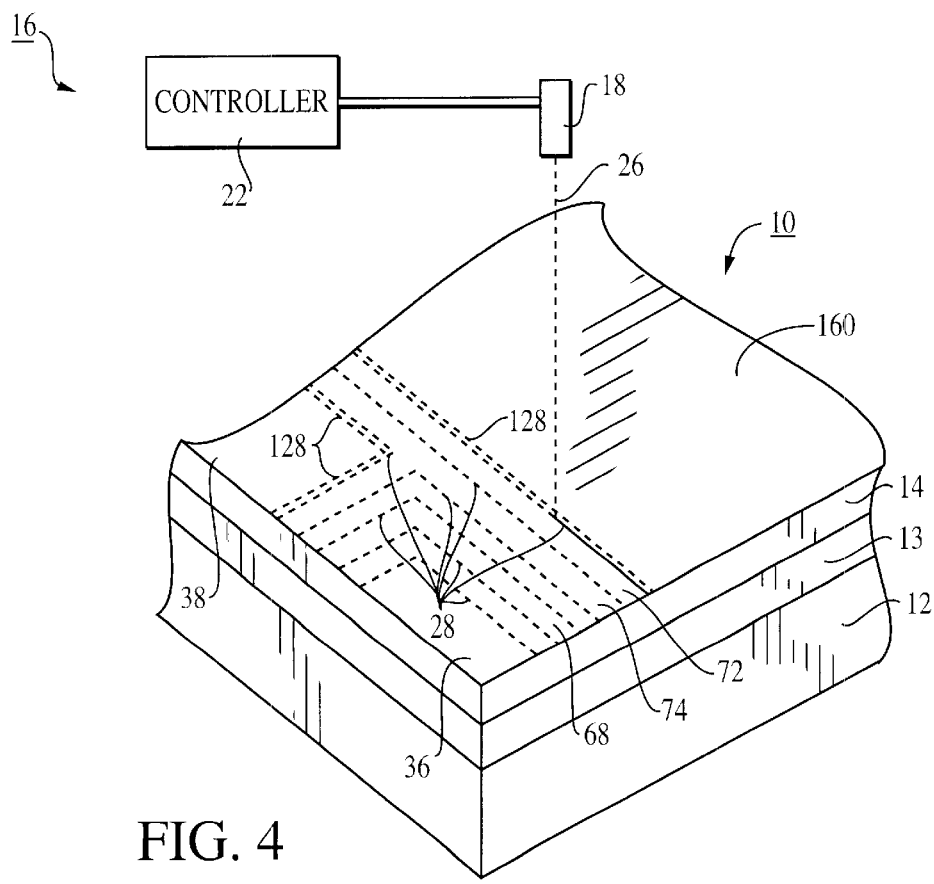
FIG. 4 is a partial perspective view of a reticle preform illustrating a first write pass in accordance with an embodiment of the present invention.

As shown in FIG. 4, a portion of the photoresist material 14 along the writing pattern 28 has been exposed by the electron beam apparatus 16 during a first write pass. The portions of the photoresist material 14 that will be exposed during the first write pass are along the writing pattern 28.

Specifically, the first write pass exposes photoresist material 14 in the first portion 36, the interlayer portion 68, a second portion 74, along the edge of a third portion 38, and along an edge of a fourth portion 160 facing the third strip 72. As shown in FIG. 4, the stream of electrons 26 has begun exposing the photoresist material 14 along the edge of the fourth portion 160 facing the third strip 72.

Figure 5:
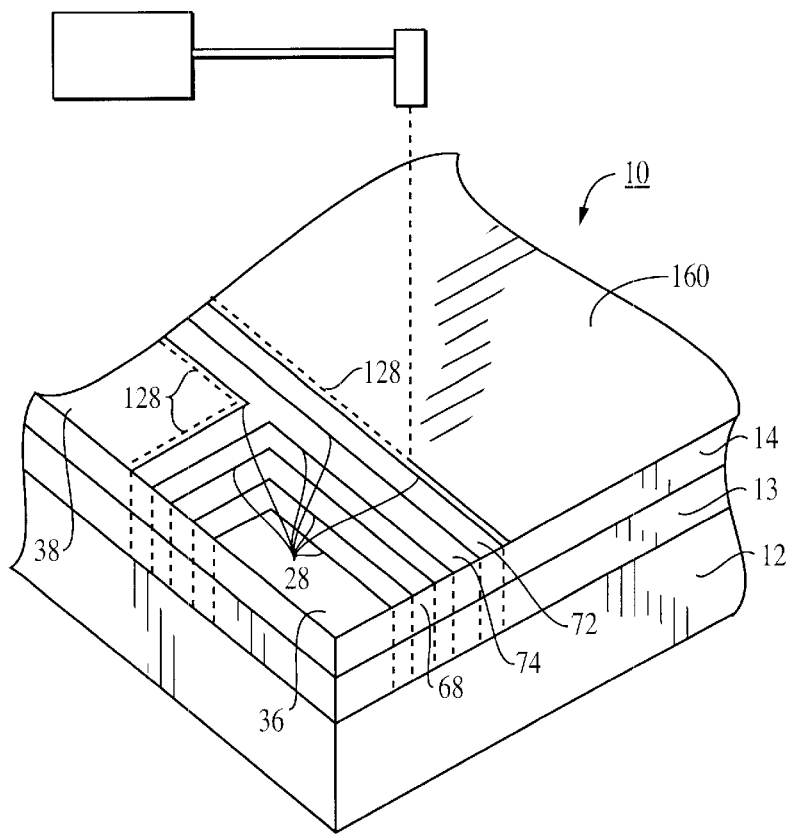
FIG. 5 is another partial perspective view of the reticle preform of FIG. 5 illustrating a second write pass.
Figure 6:
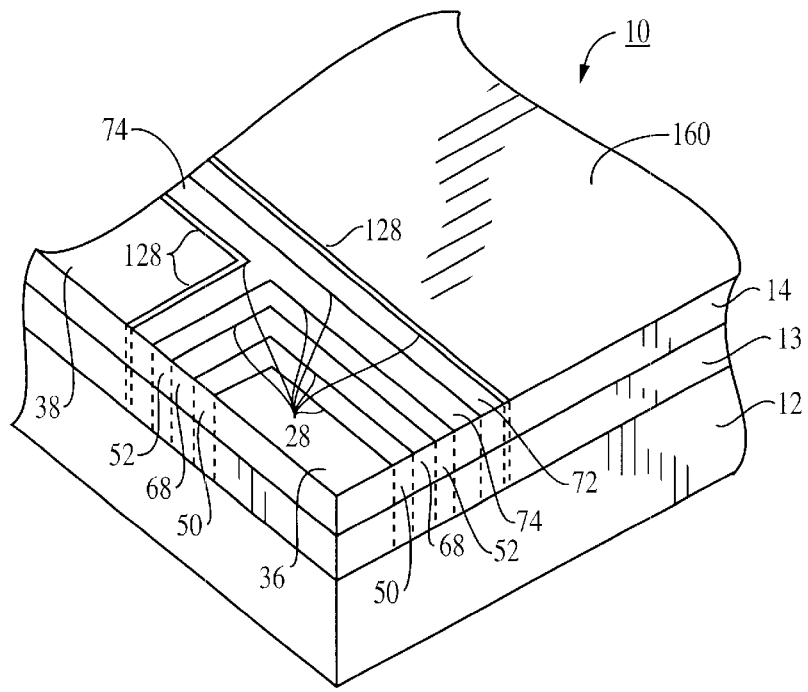
FIG. 6 is another partial perspective view of the reticle preform of FIG. 5.
Figure 7:
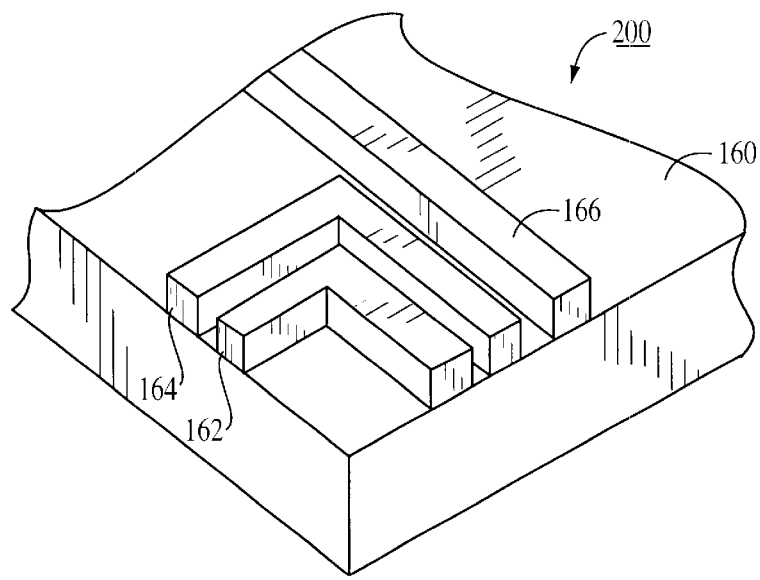
FIG. 7 is another partial perspective view showing a reticle formed from the reticle preform of FIG. 5.

In FIG. 5, all of the photoresist material 14 to be exposed during the first write pass has been exposed, as shown by a solid line along the border of the write pattern 28. Further, the second write pass has begun along the write pattern 128, as shown by the partial solid line along the edge of the fourth portion 160 facing the third strip 72. Both of the write passes have been completed as shown by the solid lines along the write patterns 28, 128 in FIG. 6.

The sequential write passes leave unexposed some portions of the photoresist material 14, namely the three strips 50, 52, 72 in the illustrated embodiment. The second write pass exposes a larger portion of photoresist material 14 than the first write pass. The exposed portions, as well as the underlying metal areas, are etched away, and then the unexposed strips 50, 52, 72 are removed, leaving metal strips 162, 164, 166 on the substrate 12 to form the reticle 200. Unlike the reticle 100, the metal strips 162, 164, 166 are accurately formed due to the multiple writing strategy.

Figure 8:
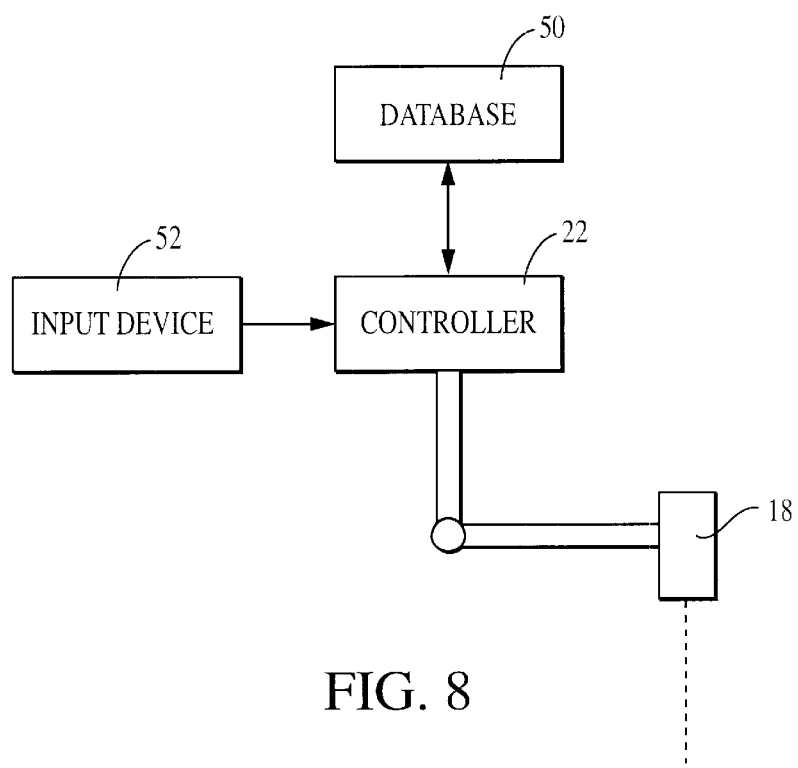
FIG. 8 is a schematic view of a controller and database constructed in accordance with an embodiment of the present invention.

FIG. 8 illustrates the interconnection between the electron beam device 18, the controller 22, a database 50, and an input device 60. The controller 22 may be mechanically and electrically connected to the electron beam device 18. The controller 22 is further electrically connected to the database 50 and the input device 60. The input device 60 may be any mechanism or system capable of inputting commands to the controller 22, such as a keypad, keyboard, touch pad, mouse, write pad, or other suitable input device.

In use, an operator inputs a command through the input device 60 to the controller 22 for the electron beam device 18 to perform a first write pass which follows a first pattern. The controller 22 accesses the database 50 to retrieve and upload the first pattern. With the first pattern uploaded, the controller 22 moves the electron beam device 18 in accordance with the first pattern, thereby accurately positioning the electron beam device 18 to expose photoresist material 14 consistent with the first pattern. In the illustrated embodiment, the first pattern exposes photoresist material 14 in areas immediately adjacent to portions of the reticle preform 10 which will be formed into metallic strips. The present invention should not be limited, however, to the embodiments described and illustrated herein. In particular, sequential write pass patterns other than those shown in the drawings may be employed.

After the electron beam device 18 has exposed all the photoresist material 14 to be exposed during the first write pass, an operator inputs a command through the input device 60 to the controller 22 for the electron beam device 18 to perform a second write pass following a second pattern. The controller 22 accesses the database 50 to retrieve and upload the second pattern. With the second pattern uploaded, the controller 22 moves the electron beam device 18 in accordance with the second pattern, thereby accurately positioning the electron beam device 18 to expose photoresist material 14 consistent with the second pattern.

The second pattern exposes photoresist material 14 in large areas adjacent to areas of the reticle preform 10 which will be formed into the metallic strips. If electrostatic energy builds up due to the exposure of such large areas, the stream of electrons 26 may become displaced from the path it should take consistent with the second pattern. However, since the first pattern exposed photoresist material 14 immediately adjacent to the areas of the reticle preform 10 which will be etched into metallic strips, adverse effects stemming from a less accurate electron stream 26 in the second write pass are minmized.

Instead of an operator inputting two separate commands to the controller 22, an operator may select a pair of write patterns, and send a single command to the controller 22 to perform the first of the pair of write patterns, and then perform the second of the pair of write patterns.

Figure 9:
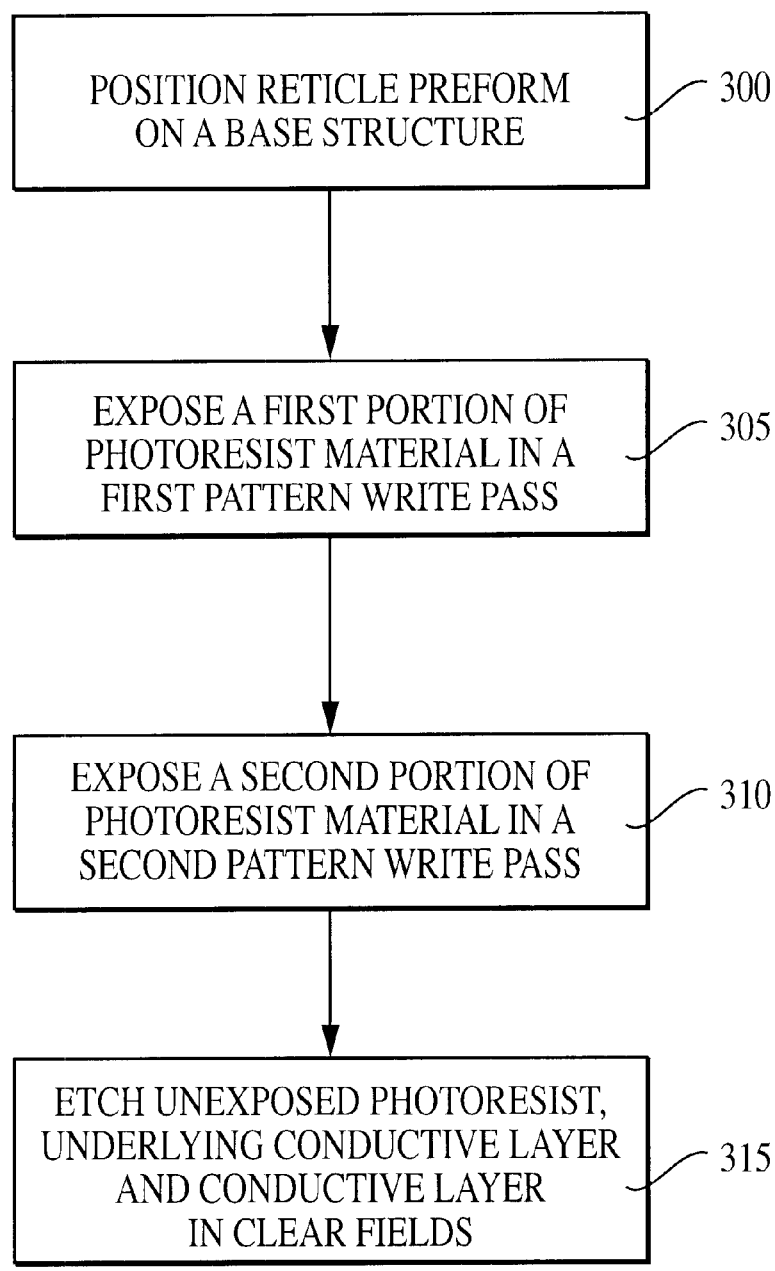
FIG. 9 is a flow diagram of a method of forming a reticle in accordance with an embodiment of the present invention.
Figure 10:
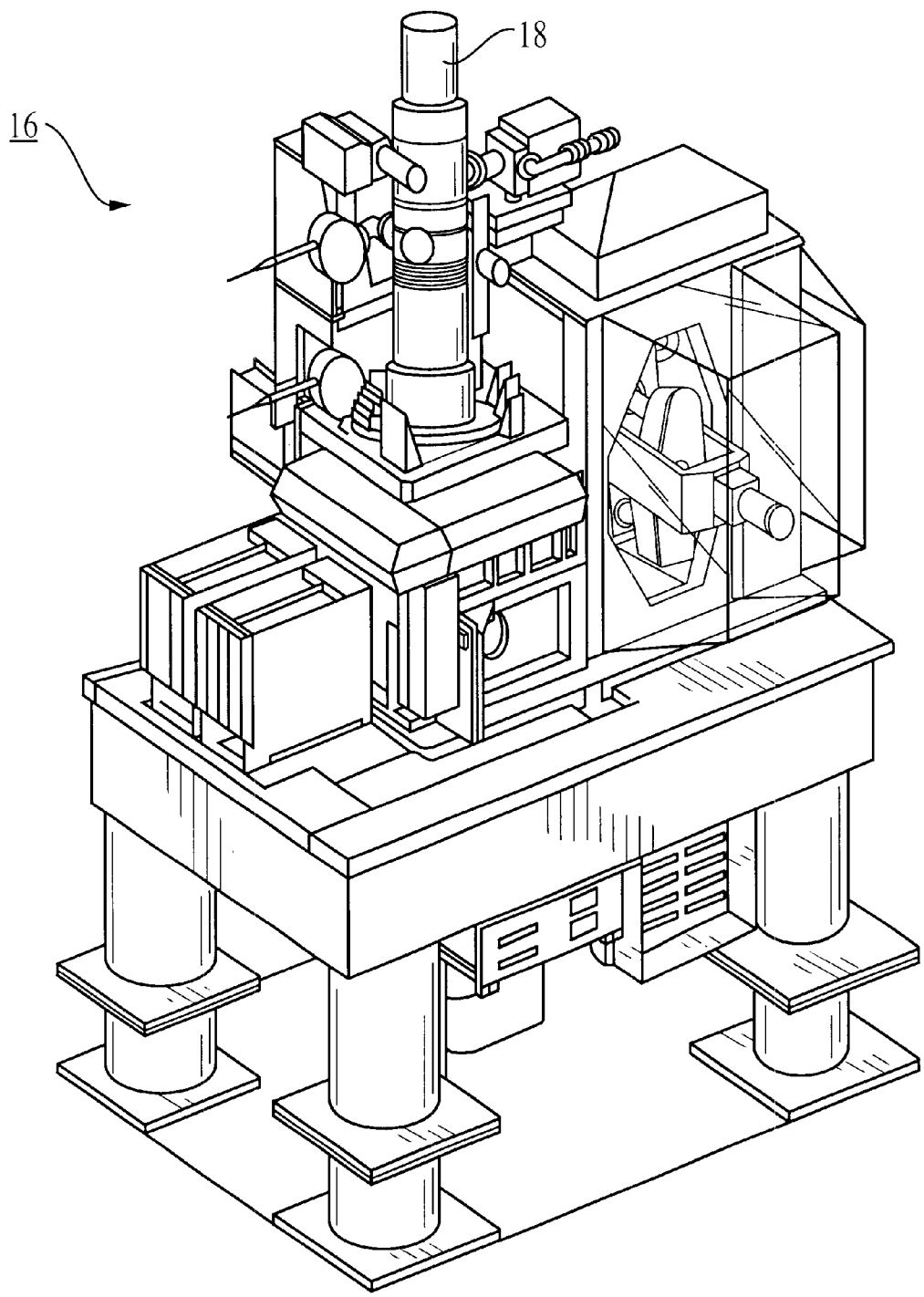
FIG. 10 is a perspective view of an electron beam apparatus for use in the formation of a reticle in accordance with an embodiment of the present invention.

FIG. 9 illustrates steps for preparing a reticle in accordance with one embodiment of the present invention. A reticle preform 10 is positioned on a base structure 24 at step 300. A first portion of photoresist material is exposed in a first write pass at step 305. A second portion of photoresist material is exposed in a second write pass at step 310. Then, the exposed photoresist material is developed at step 315 and the underlying metal is etched to form a reticle 200.

As can be seen by the embodiments described herein, the present invention encompasses a method of inhibiting adverse effects stemming from electrostatic charge in a localized area of a photoresist material during the formation of a reticle. The method utilizes a multiple (two or more) write pass technique in which the first write pass of electron beam energy is directed at a small area of the photoresist immediately adjacent to where conductive strips will be etched, and the second or subsequent write pass of electron beam energy is directed at the clear field locations.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the foregoing description has focussed on the fabrication of reticles, it is also applicable for the fabrication of semiconductor masks. Further, while a dual write pass strategy has been described, a multiple write pass strategy may be employed. Accordingly, this invention is not seen as limited by the foregoing description, but is only limited by the scope of the appended claims.

What is claimed as new and desired to be protected by Letters Patent of the United States is:

1. A method of forming a reticle from a reticle preform comprising:
    exposing a first portion of a photoresist layer over said preform with an electron beam in accordance with a first writing pattern; and
    subsequently exposing a second portion of the photoresist layer with an electron beam in accordance with a second writing pattern, said exposure of said preform with said first and second writing patterns inhibiting a buildup of electrostatic energy in the reticle preform; wherein an entire thickness of said first and second portions is exposed.

2. The method of claim 1, wherein said second writing pattern exposes more of the photoresist layer than said first writing pattern.

3. The method of claim 2, wherein said first writing pattern is designed for exposing portions of the photoresist layer immediately adjacent to unexposed portions of the photoresist layer.

4. The method of claim 2, further comprising removing exposed portions of the photoresist layer.

5. The method of claim 4, further comprising etching a conductive layer beneath the photoresist layer.

6. The method of claim 5, further comprising forming a pattern in the conductive layer.

7. The method of claim 6, wherein said pattern forming in the conductive layer comprises forming a pattern in chromium.

8. The method of claim 6, wherein said pattern forming in the conductive layer comprises forming a pattern in molybdenum silicide.

9. The method of claim 6, wherein said pattern forming in the conductive layer comprises forming a pattern in chromium fluoride.

10. The method of claim 6, wherein said pattern forming in the conductive layer comprises forming a pattern in titanium nitride.

11. The method of claim 1, further comprising positioning the reticle preform on a base structure.

12. An intermediate structure for use in forming a photolithography device, said intermediate structure comprising:
    a transparent substrate;
    a light blocking material layer provided over said substrate; and
    a photoresist layer provided over said substrate and including first and second portions which have been patterned through multiple write passes of electron beam energy over said substrate and wherein an entire thickness of said first and second portions is exposed.

13. The intermediate structure of claim 12, wherein said substrate comprises quartz.

14. The intermediate structure of claim 12, wherein said substrate comprises glass.

15. The intermediate structure of claim 12, wherein said light blocking material layer comprises metal.

16. The intermediate structure of claim 15, wherein said metal comprises chromium.

17. The intermediate structure of claim 15, wherein said metal comprises molybdenum silicide.

18. The intermediate structure of claim 12, wherein the photolithography device is a reticle.

19. The intermediate structure of claim 12, wherein the photolithography device is a semiconductor mask.

20. A photolithography device used in forming a semiconductor device, said photolithography device comprising:
    a quartz substrate; and
    a chromium layer provided on said substrate which has been patterned using a multiple write pass patterned photoresist layer in which said photoresist layer is patterned by at least a first write pass of an electron beam and a subsequent second write pass of an electron beam, wherein an entire thickness of said photoresist layer is exposed through said first and second write passes, said chromium layer including at least one portion adjacent a clear field.

21. The photolithography device of claim 20, wherein the photolithography device is a reticle.

22. The photolithography device of claim 20, wherein the photolithography device is a semiconductor mask.

* * * * *